United States Patent [19]

Hayakawa et al.

[11] Patent Number: 4,894,836
[45] Date of Patent: Jan. 16, 1990

[54] SEMICONDUCTOR DEVICE

[75] Inventors: Toshiro Hayakawa, Nara; Takahiro Suyama; Masafumi Kondo, both of Tenri; Kosei Takahashi, Nara, all of Japan

[73] Assignee: Sharp Kabushiki Kaisha, Osaka, Japan

[21] Appl. No.: 159,797

[22] Filed: Feb. 24, 1988

[30] Foreign Application Priority Data

Feb. 24, 1987 [JP] Japan .................................. 62-42258

[51] Int. Cl.⁴ .............................................. H01S 3/19
[52] U.S. Cl. ......................................... 372/45; 372/44; 357/4; 357/17
[58] Field of Search .................. 372/45, 44; 357/4, 17

[56] References Cited

U.S. PATENT DOCUMENTS

| | | | |
|---|---|---|---|
| 4,366,569 | 12/1982 | Hirao et al. | 372/46 |
| 4,416,012 | 11/1983 | Botez et al. | 372/45 |
| 4,480,331 | 10/1984 | Thompson | 372/45 |
| 4,512,022 | 4/1985 | Tsang | 372/45 |
| 4,573,161 | 2/1986 | Sakai et al. | 372/45 |
| 4,631,802 | 12/1986 | Hayashi et al. | 372/45 |
| 4,635,268 | 1/1987 | Motegi et al. | 372/45 |
| 4,745,612 | 5/1988 | Hayakawa et al. | 372/45 |
| 4,750,183 | 6/1988 | Takahashi et al. | 372/45 |
| 4,757,510 | 6/1988 | Kaheno et al. | 372/45 |

FOREIGN PATENT DOCUMENTS

| | | |
|---|---|---|
| 0044571 | 1/1982 | European Pat. Off. . |
| 0125738 | 11/1984 | European Pat. Off. . |
| 0206496 | 12/1986 | European Pat. Off. . |
| 0210616 | 2/1987 | European Pat. Off. . |
| 0215298 | 3/1987 | European Pat. Off. . |
| 5948976 | 3/1984 | Japan . |
| 61207090 | 9/1986 | Japan . |
| 1378128 | 12/1974 | United Kingdom ................. 372/45 |
| 2100501A | 12/1982 | United Kingdom . |

OTHER PUBLICATIONS

Patent Abstracts of Japan (Jun. 1984) 8(139), E-253,1576, Appln. No. 57-160054.
Patent Abstracts of Japan (Nov. 22, 1984) 9(256), E-280,1693, Appln. No. 59-127893.
Kurobe et al. (1986) Electronics Letters, 22(21):1117-1118.
T. Mimura et al., Jap. J. Appl. Phys. (1980) 19:L225-27.
W. T. Tsang, Appl. Phys. Lett. (1981) 39:786-88.
N. K. Dutta, J. Appl. Phys. (1982) 53:7211-14.
Smith, Jul./Aug. 1986, Xerox Disclosure Journal 11(4):151-152.
Hayakawa et al. (86) Applied Physics Letters, 49(11):636-638.
Patent Abstracts of Japan (11/29/85) 9(302), E-362,2025, Appln. No. 58-250138.
H. Iwamura et al., Elect. Lett. (1983) 19:180-81.
A. Sugimura, IEEE J. Quant Elec. (1984) QE-20:3-36-43.
D. A. B. Miller et al., IEEE J. Quant. Elect. (1985) QE-21:1462-76.
S. Tarucha et al., Jap. J. Appl. Phys. (1985) 24:L442-44.
K. Wakita et al., Surface Sci. (1986) 174:233-37.
D. A. B. Miller, Surface Sci. (1986) 174:221-32.
L. Esaki, IEEE J. Quant. Elect. (1986) QE-22:1611-24.

Primary Examiner—William L. Sikes
Assistant Examiner—Georgia Y. Epps
Attorney, Agent, or Firm—Irell & Manella

[57] ABSTRACT

A semiconductor device using the quantum effect of one dimension that arises in the direction vertical to the plane of a substrate on which the device structure is disposed, wherein the plane of the substrate is substantially the (111) plane.

2 Claims, 3 Drawing Sheets

SEMICONDUCTOR DEVICE

BACKGROUND OF THE INVENTION

1. Field of the invention:

This invention relates to a high-performance semiconductor device attaining the quantum effect of one dimension, such as light-emitting diodes, semiconductor lasers, electric field effect transistors, etc.

2. Description of the prior art:

In recent years, an epitaxial growth technique for the formation of thin films such as molecular beam epitaxy (MBE), metal-organic chemical vapor deposition (MO-CVD), etc., has been developed which enables the formation of thin film epitaxial growth layers having a thickness of as thin as approximately 10 Å or less that is the order of a single molecular layer. The development of such an epitaxial growth technique, although these significantly thin films have not yet been produced by liquid phase epitaxy (LPE), allowed a device structure with the thin films to be applied to laser devices, resulting in semiconductor laser devices utilizing the quantum effect. These semiconductor devices are produced by the formation of a device structure on the (100) plane of a substrate in which the thin films are disposed in the <100> direction that is vertical to the (100) plane so that the quantum effect of one dimension arises in the <100> direction. These semiconductor devices utilize the said quantum effect of one dimension. A typical example of these semiconductor devices is a GaAs/AlGaAs quantum well (QW) laser, the production of which is based on the fact that quantization levels are established in its active layer by reducing the thickness of the active layer from several hundred A to approximately 100 A or less and which is advantageous over conventional double-heterostructure lasers in that the threshold current level is lowered and the temperature and transient characgteristics are superior. Such a quantum well laser is described in detail in the following papers:

(1) W. T. Tsang, Applied Physics Letters, vol. 39, No. 10 pp. 786 (1981)

(2) N. K. Dutta, Journal of Applied Physics, vol. 53, No. 11, pp. 7211 (1982), and (3) H. Iwamura, T. Saku, T. Ishibashi, K. Otsuka, Y. Horikoshi, Electronics Letters, vol. 19, No. 5, pp. 780 (1983).

Another typical example of the abovementioned semiconductor devices is an electric field effect transistor (FET), which utilizes the moving characteristics of electronic gas of two dimensions that are produced at the interface between the GaAs layer and the AlGaAs layer (T. Mimura, et al, Japan. J. Appl. Phys. vol. 19, 1980, p. L225).

Moreover, other examples include a variety of devices using the electric field effect of excitons within the multi-layered quantum well, typical examples of which are an optical modulator and an optical logic device. These devices are designed to one-dimensionally confine electrons and positive holes within the quantum well layer having a thickness of about 200 Å or less so that excitons can exist even at room temperature, and accordingly these devices attain operation characteristics utilizing the non-linear and linear properties of excitons (D. A. B. Miller et al: IEEE. Journal of Quantum Electronics, vol. QE-21, pp. 1462 (1985), S. Tarucha et al, Japanese Journal of Applied Physics, vol. 24, No. 6, pp. L442 (1985), K. Wakita et al, Surface Science vol. 174, pp. 233 (1986).

A variety of devices other than the abovementioned semiconductor devices have been studied which have a superlattice composed of alternate layers consisting of different semiconductor thin films with a thickness of several molecular layers and which utilize the quantum effect based on the periodicity of one dimension in the direction of the layer thickness of the said superlattice.

Since these semiconductor devices are produced on the (100) plane of a substrate, the quantum effect that is utilized in the said semiconductor devices is also based on the confinement of carrier in the <100> direction, the quantization in the <100> direction, and the periodicity in the <100> direction. On the other hand, it is well known that an electronic energy structure of semiconductor materials remarkably varies depending upon the crystal direction, and it is assumed that the quantum effect of one dimension will vary depending upon the crystal direction.

SUMMARY OF THE INVENTION

The inventors of this invention found the fact that the quantum effect of a semiconductor device in the <100> direction is greater than that of a conventional semiconductor device in the <100> direction. Based on this fact, the inventors succeeded in the production of a semiconductor device having excellent device characteristics by the use of the quantum effect in the <100> direction in which a device structure of the said device is formed on the (111) plane of a substrate.

The semiconductor device of this invention, which overcomes the above-discussed and numerous other disadvantages and deficiencies of the prior art, uses the quantum effect of one dimension that arises in the direction vertical to the plane of a substrate on which the device structure is disposed, wherein the plane of said substrate is substantially the (111) plane.

In a preferred embodiment, the substrate is made of GaAs, GaSb, InAs, InP, GaP or InSb.

In a preferred embodiment, the device is of a quantum well structure, a superlatticed structure or a modulation-doped heterostructure.

Thus, the invention described herein makes possible the objective of providing a semiconductor device that remarkably increases the quantum effect of one dimension, thereby attaining a great improvement of its device characteristics.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 1:
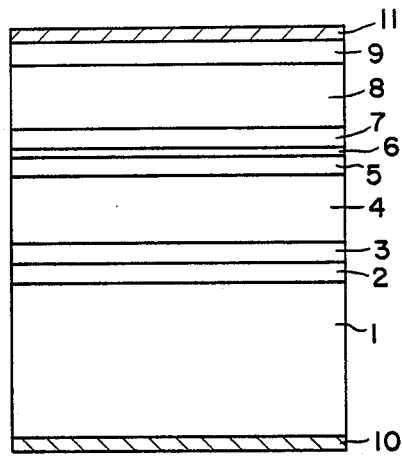
FIG. 1 is a frongt sectional view showing a semiconductor device, i.e., a quantum well semiconductor laser device, of this invention.

FIG. 1 shows a GRIN-SCH (graded-index separate confinement heterostructure) semiconductor laser device with a quantum well structure of this invention, which is produced as follows: On the plane of a Si-doped n-GaAs substrate (Si=$2\times10^{18}$cm$^{-3}$) 1 that is inclined toward the (100) plane at an angle of 0.5 degrees to the (111) B plane, a Si-doped n-GaAs buffer layer (Si=$1\times10^{18}$cm$^{-3}$; the thickness thereof being 0.5 μm) 2, a Si-doped n-Al$_v$Ga$_{1-v}$As graded buffer layer (the AlAs mole fraction v varying from 0.1 to 0.7 in the thickness direction according to the linear distribution; Si=$1\times10^{18}$cm$^{-3}$; the thickness thereof being 0.2 μm) 3, a Si-doped n-Al$_{0.7}$Ga$_{0.3}$As cladding layer (Si=$1\times10^{18}$cm$^{-3}$; the thickness thereof being 1.4 μm) 4, an undoped Al$_x$Ga$_{1-x}$As GRIN layer (the AlAs mole fraction x varying from 0.7 to 0.2 according to the parabolic distribution; the thickness thereof being 0.15 μm) 5, an undoped GaAs quantum well layer 6 that functions as an active layer for laser oscillation, an undoped Al$_x$Ga$_{1-z}$As Grin layer (the AlAs mole fraction x varying from 0.2 to 0.7 according to the parabolic distribution; and the thickness thereof being 0.15 μm) 7, a Be-doped p-Al$_{0.7}$Ga$_{0.3}$As cladding layer (Be=$5\times10^{17}$cm$^{-3}$; the thickness thereof being 1 μm) 8, and a Be-doped p-GaAs cap layer (Be=$2\times10^{18}$cm$^{-3}$; the thickness thereof being 0.5 μm) 9 are successively grown by molecular beam epitaxy. The growth temperature is 720° C. and the flux ratio of group V to group III is 2. The growth rate is 1.4 m/hour for the AlPhd 0.7Ga$_{0.3}$As cladding layers 4 and 8.

Then, an n-sided electrode 10 of AuGe/Ni/Au and a p-sided electrode 11 of AuZn/Au are formed on the back face of the n-substrate 1 and the upper face of the p-cap layer 9, respectively, by the vacuum evaporation method or the like. The wafer obtained is then cleaved, resulting in a semiconductor laser device with a cavity length of 490 m, the entire surfaces of which are covered by electrodes. The reason why the plane direction of the substrate is set to be inclined toward the (100) plane at an angle of 0.5 degrees to the (111) B plane of the substrate is to have the grown layers attain the best crystallization. By this way, the energy barrier of the quantum well layer 6 becomes sufficiently high corresponding to the value of the AlAs mole fraction i.e., x=0.2, and the changes in the refractive index of the quantum well layer 6 become sufficiently great, so that the convergence of light into the quantum well layer 6 can be effectively attained, resulting in a lowered threshold current level.

As a reference standard, on the (100) plane of a Si-doped n-GasAs substrate (Si=$2\times10^{18}$cm$^{-3}$) that has been fixed to a Mo block, a semiconductor laser device is grown at the same time in the same way as that of the above-mentioned example using the (111) plane substrate.

Figure 2:
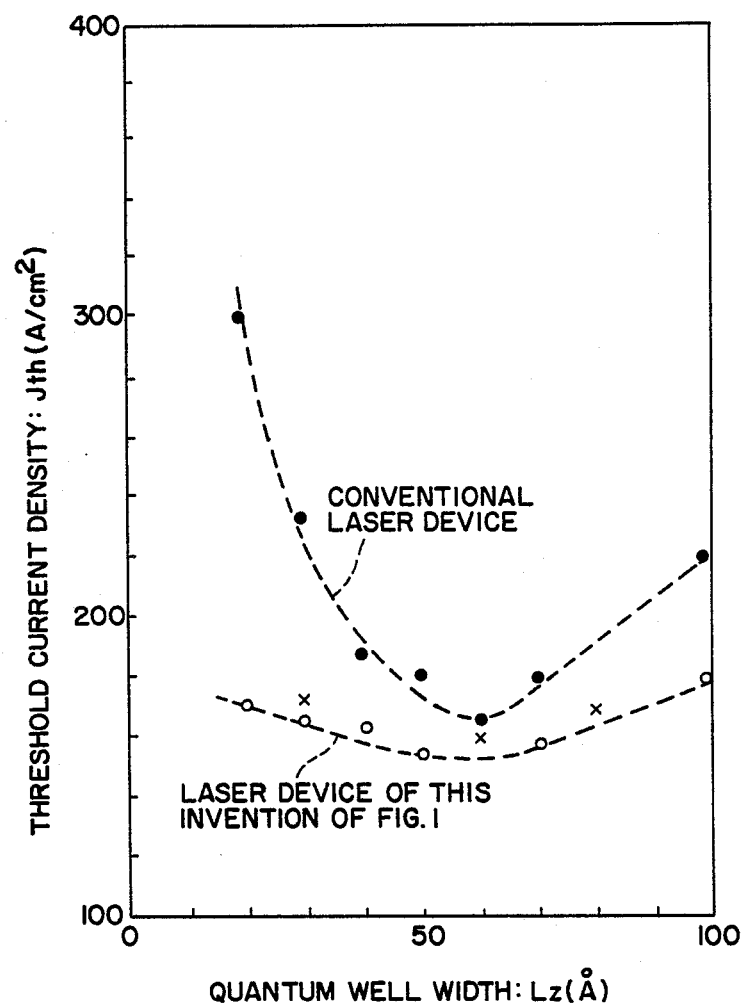
FIG. 2 is of characteristic curves showing the dependence of the threshold current density on the width of the quantum well with regard to the semiconductor laser device shown in FIG. 1 and a conventional semiconductor laser device.

In this way, semiconductor laser devices having different quantum well widths Lz can be obtained by molecular beam epitaxy. FIG. 2 shows the dependence of the laser oscillation threshold current density Jth on the quantum well width Lz with regard to the above-mentioned semiconductor laser devices, indicating that the threshold current density Jth of the semiconductor device of this invention (indicated by mark), which are formed on the (111) plane of a substrate, is lower than that of the reference standard device (indicated by mark), which are formed on the (100)plane of a substrate, over the whole range of Lz and moreover that the threshold current density Jth of the device of this invention is substantially independent of Lz. This is because the radioactive efficiency of the quantum well layer 6 of the device of this invention in the <111> direction is higher by one order or more than that of the quantum well layer of the reference standard device in the <100> direction. The dependence of Jth on Lz of a semiconductor device on the (111) plane accords with calculations in the case where the efficiency of the radiative recombination at the point of direct transition within the quantum well layer 6 is higher than that of the radiative recombination at the L point of indirect transition. the theoretical calculations thereof are described in detail in the paper: A. Sugimura, FIG. 4, IEEE Journal of Quantum Electronics, vol. QE-10, No. 4, pp. 339 (1984).

EXAMPLE 2

GRIN SCH quantum well semiconductor laser devices with the same structure as the laser device of Example 1 were produced as follows: On the (111) B plane of a Si-doped n-GaAs substrate (Si=$2\times10^{18}$cm$^{-3}$) (wherein the plane direction is in error within ±0.1 degrees) and on the plane of the said substrate that is inclined toward the <100> direction at an angle of 2 degrees to the (111) B plane of the said substrate, respectively, a Se-doped n-GaAs buffer layer (Se=$1\times10^{18}$cm$^{-3}$; the thickness thereof being 0.5 μm), a Se-doped n-Al$_{0.7}$Ga$_{0.3}$As cladding layer (Se=$1\times10^{18}$cm$^{-3}$; the thickness thereof being 1.5 μm), an undoped Al$_x$Ga$_{1-x}$As GRIN layer (the AlAs mole fraction x varying from 0.7 to 0.2 according to the parabolic distribution; and the thickness thereof being 0.15 μm), an undoped GaAs quantum well layer that functions as an active layer for laser oscillation, an undoped Al$_x$Ga$_{1-x}$As GRIN layer (the AlAs mole fraction x varying from 0.2 to 0.7 according to the parabolic distribution; and the thickness thereof being 0.15 μm), a Zn-doped p-Al$_{0.7}$Ga$_{0.3}$As cladding layer (Zn=$5\times10^{17}$cm$^{-3}$; the thickness thereof being 1 μm), and a Zn-doped p-GaAs cap layer (Zn=$2\times10^{18}$cm$^{-3}$; the thickness thereof being 0.5 μm) are successively grown by metal-organic chemical vapor deposition. The temperature of the substrate is set to be 780° C. and the growth is under atmospheric pressure. By using this way, wafers with different quantum well width Lz are obtained. Electrodes are then disposed on the back face of each substrate and the upper face of each cap layer, respectively, in the same way as described in Example 1, followed by cleaving them to form semiconductor laser devices with a cavity length of 490 μm. The value of the threshold current density Jth of each of the laser devices was measured and no difference was found in the Jth between the laser devices produced on the (111) B plane of the substrate and the laser device produced on the plane that is inclined toward the (100) plane at an angle of 2 degrees to the (111) B plane of the substrate. The dependence of Jth on Lz of the laser devices of this example is shown by mark x in FIG. 2, indicating that the threshold current density Jth of each of the laser devices of this example is substantially independent of Lz, which is similar to that of each of the laser devices of Example 1. This means that the quantum effect in the <111> direction is attained. It has become clear from the experiments by the inventors of this invention that metal-organic chemical vapor deposition allows good quality AlGaAs films to be formed on the plane of a substrate that is inclined toward the (100) plane at an angle in a wider range to the (111) plane than molecular beam epitaxy does.

EXAMPLE 3

Figure 3:
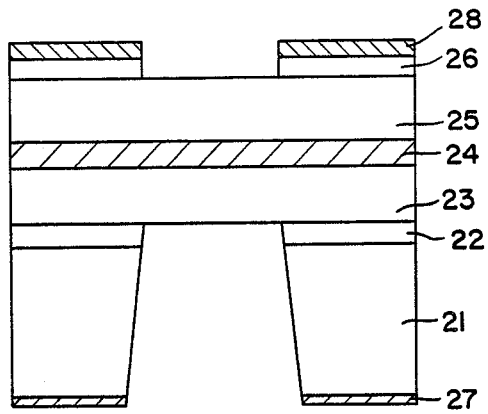
FIG. 3 is a front sectional view showing another semiconductor device, i.e., a multi-layered quantum well type light modulator, of this invention.

FIG. 3 shows a quantum well type electric field effect light modulator of this invention, which is produced as follows: On the (111) B plane of an n-GaAs substrate 21, a Se-doped n-GaAs buffer layer (Se=$1\times10^{18}$cm$^{-3}$; the thickness thereof being 0.5 μm) 22, a se-doped n-Al$_{0.7}$Ga$_{0.3}$As cladding layer (Se=$1\times10^{18}$cm$^{-3}$; the thickness thereof being 1 μm) 23, a non-doped multi-layered quantum well later (composed of alternate layers consisting of ten GaAs quantum well layers of a thickness of 100 Å each and nine Al$_{0.7}$Ga$_{0.3}$As barrier layers of a thickness of 100 Å each) 24, a Zn-doped p-Al$_{0.7}$Ga$_{0.3}$As cladding layer (Zn=$5\times10^{17}$cm$^{-3}$; the thickness thereof being 1 μm) 25, and a Zn-doped p-GaAs cap layer (An=$2\times10^{18}$cm$^{-3}$; and the thickness thereof being 0.2 μm) 26 are successively grown under atmospheric pressure by metal-organic chemical vapor deposition. The growth temperature is set to be 780° C.

Then, the central portion of each of the substrate 21 and the cap layer 26 is removed into a circular shape by an etching technique, and an n-sided electrode 27 of AuGe/Ni/Au and a p-sided electrode 28 of AuZn/Au are disposed on the back face of the substrate 21 and the upper face of the cap layer 26, respectively, by the vacuum evaporation method, resulting in an electric field device.

As a reference standard, an electric field device with the same structure as the above-mentioned is produced on the (100) plane of a Si-doped n-GaAs substrate Si=$2\times10^{18}$cm$^{-3}$) placed on the same susceptor at the same time in the same manner as the above-mentioned device of this example.

Figure 4:
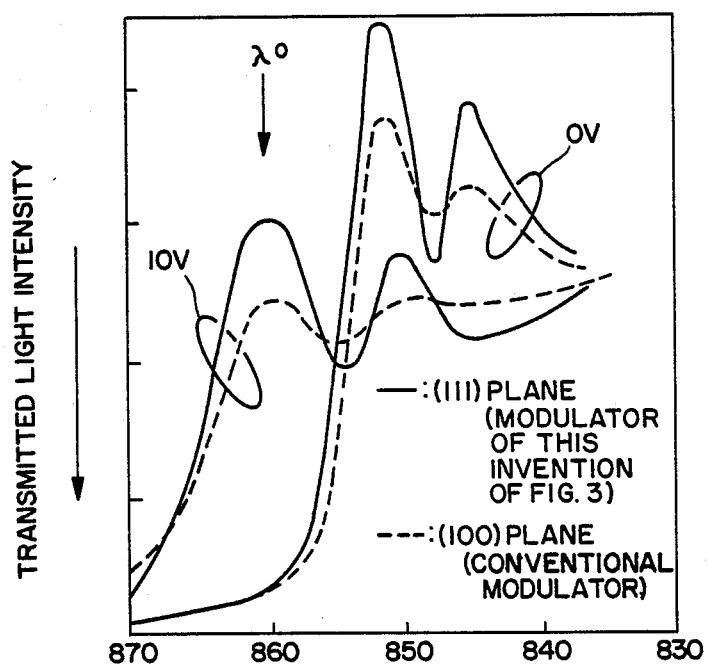
FIG. 4 is of characteristic curves showing the dependence of the transmitted spectrum on the applied volt

FIG. 4 shows the transmitted spectra attained by the device of this example and the reference standard device when no reversed bias voltage is applied to the devices and when a reversed bias voltage of 10 volts is applied thereto, wherein the spectrum of the device of this example is indicated by solid line and the spectrum of the reference standard device is indicated by dotted line. It can be seen from FIG. 4 that the absorption peaks of the device of this example due to excitons are higher than those of the reference standard device and that the absorption peaks of the device of this example is maintained to be narrow even when a reversed bias voltage is applied thereto; namely, elcitons are not broken even by the application of an electric field thereto. This means that constraining energy within the quantum well in the <111> direction is greater than constraining energy within the quantum well in the <100> direction. When the said devices work at an operation wavelength (λ$_0$) of 860 nm, they attain a modulation that is higher by 10% or more than the modulation of conventional devices produced on the (100) plane of a substrate. Such an improvement of the operation characteristics of the said devices of this example is based on an increase in the absorption of light by excitons at the time when an electric field is applied, and accordingly when the principle of this example is applied to a variety of devices described in D. A. B. MILLER, Surface Science, vol. 174, pp. 221 (1986), the operation characteristics thereof will be remarkably improved.

EXAMPLE 4

Figure 5:
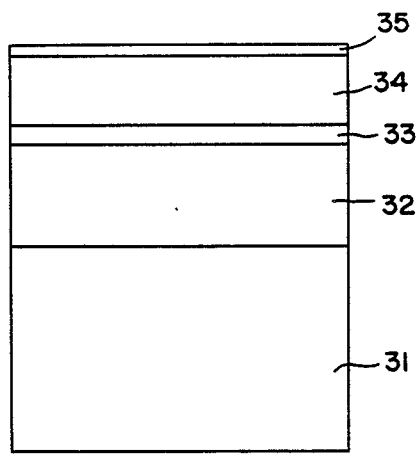
- FIG. 5 is a front sectional view showing another semiconductor device, i.e., a modulation doped-structure semiconductor device, of this invention.

FIG. 5 shows a modulation doped structure semiconductor device of this invention, which is produced as follows: On the plane of a semi-insulating GaAs substrate 31 that is inclined toward the <100> direction at an angle of 0.5 degrees to the (111) B plane of the said substrate, an undoped GaAs layer (the thickness thereof being 1 μm) 32, an undoped Al$_{0.3}$Ga$_{0.7}$As spacing layer (the thickness thereof being 200 Å) 33, a Si-doped n-Al$_{0.3}$Ga$_{0.7}$As carrier supplying layer (Si=$1\times10^{18}$cm$^{-3}$; the thickness thereof being 0.1 μm) 34, and a Si-doped n-GaAs cap layer (Si=$1\times10^{18}$cm$^{-3}$; the thickness thereof being 0.1 μm) 35 are successively grown by molecular beam epitaxy. The growth temperature is 690° C. and the flux ratio of V group to III group is 2. The growth rate is 1.4 μm/hour for the Al$_{0.3}$Ga$_{0.7}$As layers 33 and 34.

As a reference standard, a modulation doped structure semiconductor device with the same structure as that of this example is produced on the (100) plane of a semi-insulating GaAs substrate that is placed on a Mo block at the same time in the same way as that of this example.

The electron mobility of each of the devices of this example and the reference standard device is measured at 300K and 77K by the Hall measuring method and the results obtained are as follows: The device of this example produced on the plane of a substrate that is misoriented toward the <100> direction at an angle of 0.5 degrees to the (111) B plane exhibits 300,000 cm$^2$/V.S at 77K and 11,000 cm$^2$/V.S at 300K, whereas the reference standard device (i.e., a conventional device) produced on the (100) plane of a substrate exhibits 200,000 cm$^2$/V.S at 77K and 6,500 cm$^2$/V.S at 300K, both of which are lower than those of the device of this example.

Although the above-mentioned examples disclose only quantum well laser devices, optical modulators and modulation-doped structure devices, this invention is, of course, applicable to any semiconductor device with the use of at least the quantum effect of one dimension; for example, this invention is applicable to a variety of semiconductor devices with a superlatticed structure that is composed of alternate layers consisting of two different semiconductor thin films, resulting in a periodicity in the direction of the grown layer thickness whereby the changes in its energy-band structure are attained (L. Esaki, IEEE Journal of Quantum Electronics, vol. QE-22, No. 9, pp. 1611 (1986)).

Moreover, the plane direction of a substrate is not limited to the B plane, but the A plane can be used to attain the quantum effect in the <111> direction. Furthermore, it is selected depending upon the growth method to be used which plane of a substrate that is inclined at a certain angle to the (111) plane of the substrate is the most pertinent. However, in fact, the quantization can be basically achieved in the <111> direction. Kinds of substrate are not limited to the GaAs material, but various kinds of substrate such materials as InP, InAs, GaP, InSb, GaSb, etc., can be used.

It is understood that various other modifications will be apparent to and can be readily made by those skilled in the art eithout departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor device using the quantum effect of one dimension, said device comprising a substrate, a first electrode formed under said substrate, a device structure selected from a quantum well structure, a superlattice structure, and a modulation-doped heterostructure disposed on said substrate, and a second electrode formed on said device structure, the device wherein said quantum effect of one dimension based on said device structure arises in the direction vertical to the plane of said substrate on which said device structure is disposed, and wherein the plane of said substrate is substantially the (111) plane, where said quantum well structure comprises successively a first cladding layer, a quantum well layer having a thickness of about 100 Å or less, and a second cladding layer; said superlattice structure including a multiple well structure comprises a first cladding layer, a multi-layered well layer comprising alternate layers of well layers and barrier layers having a thickness of about 200 Å or less formed on said first cladding layer, and a second cladding layer formed on said multi-layered well layer; and said modulation-doped heterostructure comprises an undoped layer of a first semiconductor, an undoped spacing layer of a second semiconductor having a thickness of about 200 Å or less formed on said undoped layer, and a doped carrier supplying layer of the second semiconductor formed on said undoped spacing layer.

2. A semiconductor device according to claim 1, wherein said substrate is made of GaAs, GaSb, InAs, InP, GaP or InSb.

* * * * *